US012681055B2

(12) United States Patent
Huang

(10) Patent No.: US 12,681,055 B2
(45) Date of Patent: Jul. 14, 2026

(54) MULTI-PATH CURRENT DIFFERENCE DETECTION DEVICE

(71) Applicant: DELTA ELECTRONICS, INC., Taoyuan City (TW)

(72) Inventor: Weite Huang, Taoyuan City (TW)

(73) Assignee: DELTA ELECTRONICS, INC., Taoyuan City (TW)

( * ) Notice: Subject to any disclaimer, the term of this patent is extended or adjusted under 35 U.S.C. 154(b) by 141 days.

(21) Appl. No.: 18/668,591

(22) Filed: May 20, 2024

(65) Prior Publication Data

US 2025/0251431 A1 Aug. 7, 2025

(30) Foreign Application Priority Data

Feb. 7, 2024 (CN) .......................... 202410174032.7

(51) Int. Cl.
| | |
|---|---|
| *G01R 19/165* | (2006.01) |
| *G01R 15/18* | (2006.01) |
| *G01R 15/20* | (2006.01) |
| *G01R 19/00* | (2006.01) |
| *G01R 19/10* | (2006.01) |
| *G01R 19/14* | (2006.01) |

(Continued)

(52) U.S. Cl.
CPC ....... *G01R 19/16571* (2013.01); *G01R 15/18* (2013.01); *G01R 15/202* (2013.01); *G01R 15/205* (2013.01); *G01R 19/10* (2013.01); *G01R 19/0092* (2013.01); *G01R 19/14* (2013.01); *G01R 19/15* (2013.01); *G01R 19/165* (2013.01); *G01R 19/16566* (2013.01); *G01R 19/2506* (2013.01)

(58) Field of Classification Search
CPC .. G01R 19/16571; G01R 19/10; G01R 15/18; G01R 15/202; G01R 15/205; G01R 19/14; G01R 19/15; G01R 19/165; G01R 19/16566; G01R 19/2506; G01R 19/0092
USPC ...................................................... 324/140 R
See application file for complete search history.

(56) References Cited

U.S. PATENT DOCUMENTS

| | | | |
|---|---|---|---|
| 9,081,041 B2 | 7/2015 | Friedrich et al. | |
| 11,313,917 B2 | 4/2022 | Cong et al. | |

(Continued)

FOREIGN PATENT DOCUMENTS

| | | |
|---|---|---|
| CN | 105301336 A | 2/2016 |
| CN | 111965533 A | 11/2020 |

(Continued)

OTHER PUBLICATIONS

Search Report dated Sep. 30, 2024 of the corresponding PCT patent application No. PCT/CN2024/076564.

(Continued)

*Primary Examiner* — Raul J Rios Russo
(74) *Attorney, Agent, or Firm* — MUNCY, GEISSLER, OLDS & LOWE, P.C.

(57) ABSTRACT

A multi-path current difference detection device includes an induction component and a determination unit. The induction component induces a plurality of currents flowing through a plurality of paths, and calculates a net current value of a plurality of current values of the plurality of currents. The determination unit receives a current signal corresponding to the net current value, and provides a detection signal when determining that the current signal is greater than or equal to a current threshold.

16 Claims, 8 Drawing Sheets

100

(51) Int. Cl.
    *G01R 19/15*        (2006.01)
    *G01R 19/25*        (2006.01)

(56)          References Cited

U.S. PATENT DOCUMENTS

| | | | |
|---|---|---|---|
| 11,320,466 B1 | 5/2022 | Briano et al. | |
| 11,366,141 B1 | 6/2022 | Daubert et al. | |
| 11,402,409 B1 | 8/2022 | Mcnally et al. | |
| 2009/0086865 A1* | 4/2009 | Drapkin | H04L 25/085 |
| | | | 375/350 |
| 2012/0140371 A1 | 6/2012 | Gaul et al. | |
| 2014/0009299 A1 | 1/2014 | Fahrenkrug et al. | |
| 2015/0084616 A1* | 3/2015 | Frampton | G01R 21/06 |
| | | | 324/76.77 |
| 2017/0115329 A1 | 4/2017 | Schuellein et al. | |
| 2019/0267539 A1 | 8/2019 | Green et al. | |
| 2020/0386823 A1* | 12/2020 | Lee | G01R 27/08 |
| 2022/0065899 A1 | 3/2022 | Gabriel et al. | |
| 2022/0158439 A1* | 5/2022 | Feng | H10D 89/601 |
| 2022/0187892 A1* | 6/2022 | Zhang | G06F 1/28 |
| 2023/0333147 A1 | 10/2023 | Messier et al. | |
| 2024/0151755 A1* | 5/2024 | Sasaki | G01R 31/52 |

FOREIGN PATENT DOCUMENTS

| | | | |
|---|---|---|---|
| CN | 114137275 A | 3/2022 | |
| CN | 217238197 U | 8/2022 | |
| CN | 115902338 A | 4/2023 | |
| EP | 2815244 B1 | 8/2020 | |
| JP | 2002214272 A | 7/2002 | |
| JP | 2016045143 A | 4/2016 | |
| JP | 2018170846 A | 11/2018 | |
| KR | 102428537 B1 | 8/2022 | |
| TW | 201112559 A | 4/2011 | |

OTHER PUBLICATIONS

Search Report dated Nov. 26, 2024 of the corresponding European patent application No. 24173120.7.
Office Action dated Aug. 14, 2024 of the corresponding Taiwan patent application No. 113104890.

* cited by examiner

200

200

200

MULTI-PATH CURRENT DIFFERENCE DETECTION DEVICE

BACKGROUND

Technical Field

The present disclosure relates to a current difference detection device, and more particularly to a multi-path current difference detection device.

Description of Related Art

The statements in this section merely provide background information related to the present disclosure and do not necessarily constitute prior art.

Currently, a current transformer (CT) is commonly used to detect different current directions of two or more paths. However, the current transformer has the disadvantages of being large, complex in circuit, and expensive. In addition, the current transformer is used to detect current, which is easily affected by temperature, and its accuracy will drift. Therefore, in addition to current transformers, Hall sensors are also used for current detection. However, a single Hall sensor can only be used to detect current in a single path, and therefore if currents flowing two or more paths with different current directions need to be detected, more Hall sensors must be used, which will result in increased costs.

Therefore, how to design a multi-path current difference detection device to solve the problems and technical bottlenecks in the existing technology has become a critical topic in this field.

SUMMARY

An objective of the present disclosure is to provide a multi-path current difference detection device. The multi-path current difference detection device includes an induction component and a determination unit. The induction component induces a plurality of currents flowing through a plurality of paths, and calculates a net current value of a plurality of current values of the plurality of currents. The determination unit receives a current signal corresponding to the net current value, and provides a detection signal when determining that the current signal is greater than or equal to a current threshold.

In one embodiment, the determination unit includes a signal amplifier and a voltage follower. The signal amplifier receives the current signal and amplifies the current signal. The voltage follower is connected to the signal amplifier and receives the current signal amplified by the signal amplifier. Based on the current signal amplified by the signal amplifier being greater than or equal to the current threshold, the voltage follower is configured to provide the detection signal with a high level. Based on the current signal amplified by the signal amplifier being less than the current threshold, the voltage follower is configured to provide the detection signal with a low level.

In one embodiment, the multi-path current difference detection device is an integrated circuit.

In one embodiment, a current value corresponding to the current threshold is zero amp.

In one embodiment, each current is an alternating-current current, and a current value corresponding to the current threshold is 15 milliamps.

In one embodiment, each current is an alternating-current current or a direct-current current, and a current value corresponding to the current threshold is direct-current 3 to 6 milliamps.

In one embodiment, the induction component is a Hall component, a tunneling magnetoresistance, an anisotropic magnetoresistance, a giant magnetoresistance, a colossal magnetoresistance, an ordinary magnetoresistance, or a shunt resistor.

In one embodiment, the signal amplifier is an operational amplifier.

In one embodiment, the multi-path current difference detection device is disposed on a circuit board, and the circuit board includes a plurality of layer boards with a laminated structure. The plurality of paths is respectively disposed on different layer boards.

Another objective of the present disclosure is to provide a multi-path current difference detection device. The multi-path current difference detection device includes a sensing component and a determination unit. The sensing component receives a plurality of currents flowing through a plurality of paths. The determination unit receives a plurality of current signals corresponding to a plurality of current values of the plurality of currents, calculates a net current value of the plurality of current values, and provides a detection signal when determining that a net current signal corresponding to the net current value is greater than or equal to a current threshold.

In one embodiment, the determination unit includes a plurality of signal amplifiers, a plurality of voltage followers, and a computation unit. The plurality of signal amplifiers respectively receives the plurality of current signals and respectively amplify the plurality of current signals. The plurality of voltage followers is correspondingly connected to the plurality of signal amplifiers and respectively receive the plurality of current signals amplified by the plurality of signal amplifiers. The computation unit is connected to the plurality of voltage followers, and respectively receives the plurality of current signals amplified by the plurality of signal amplifiers, and sums the plurality of current signals to generate the net current signal corresponding to the net current value. Based on the net current signal being greater than or equal to the current threshold, the computation unit is configured to provide the detection signal with a high level. Based on the net current signal being less than the current threshold, the computation unit is configured to provide the detection signal with a low level.

In one embodiment, the multi-path current difference detection device is an integrated circuit.

In one embodiment, a current value corresponding to the current threshold is zero amp.

In one embodiment, each current is an alternating-current current, and a current value corresponding to the current threshold is 15 milliamps.

In one embodiment, each current is an alternating-current current or a direct-current current, and a current value corresponding to the current threshold is direct-current 3 to 6 milliamps.

In one embodiment, the sensing component is a Hall component, a tunneling magnetoresistance, an anisotropic magnetoresistance, a giant magnetoresistance, a colossal magnetoresistance, an ordinary magnetoresistance, or a shunt resistor.

In one embodiment, the signal amplifier is an operational amplifier.

In one embodiment, the multi-path current difference detection device is disposed on a circuit board, and the circuit board includes a plurality of layer boards with a laminated structure. The plurality of paths is respectively disposed on different layer boards.

Accordingly, the multi-input power system proposed by the present disclosure has the following characteristics and advantages: 1. the multi-path current difference detection device of the present disclosure may be implemented as a packaged integrated circuit, and therefore the volume and occupied can be greatly reduced; 2. the multi-path current difference detection device of the present disclosure can implement multi-path current difference detection in a non-contact manner or a contact manner; 3. the multi-path current difference detection device of the present disclosure can be used to detect AC current or DC current; 4. in a preferred embodiment, an AC current difference of more than 15 mA can be accurately detected, or a DC current difference of more than 6 mA and less than 3 mA can be accurately detected; 5. electromagnetic interference (EMI) can be avoided through the spacing design of different current paths; 6. the detection time of the current difference detection of the present disclosure can be less than 1 second; 7. the detection accuracy of the current difference detection of the present disclosure is higher than 95% (that is, the error is lower than 5%); 8. the multi-path current difference detection device of the present disclosure can operate in an environment higher than 150° C.; 9. the distance between multiple layer boards of the circuit board of the present disclosure having a laminated structure can be designed to be 0.4±0.1 mm.

It is to be understood that both the foregoing general description and the following detailed description are exemplary, and are intended to provide further explanation of the present disclosure as claimed. Other advantages and features of the present disclosure will be apparent from the following description, drawings, and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
FIG. 1 is a schematic diagram of a conventional current transformer for detecting current.
Figure 1:
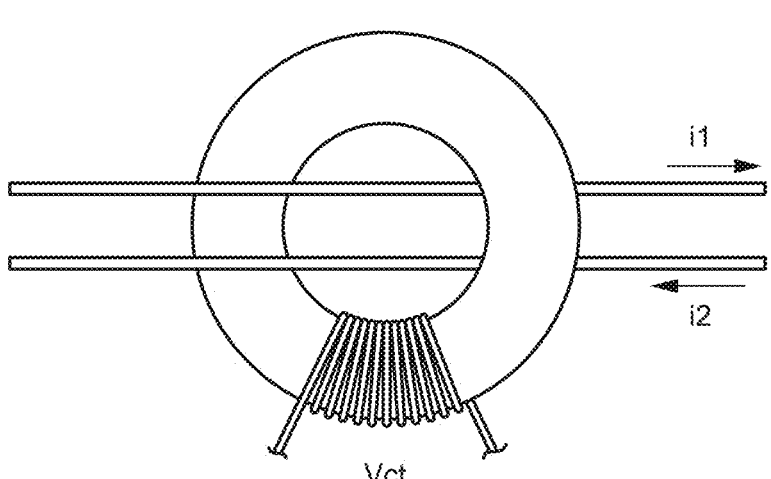

Reference will now be made to the drawing figures to describe the present disclosure in detail. It will be understood that the drawing figures and exemplified embodiments of present disclosure are not limited to the details thereof. The implementation of the present disclosure is described below through specific examples, and those who are familiar with this technology can easily understand other advantages and effects of the present disclosure from the content disclosed in this specification. The present disclosure can also be implemented or applied through other different specific examples, and the details in the present disclosure can also be modified and changed based on different viewpoints and applications without departing from the spirit of the present disclosure.

The structures, proportions, sizes, and number of components shown in the drawings attached to the present disclosure are only used to match the content in the present disclosure, for those who are familiar with this technology to understand and read, and are not used to limit the implementation of the present disclosure. Any modification of structure, change of proportional relationship or adjustment of size shall fall within the scope covered by the technical content disclosed in the present disclosure, provided that it does not affect the effect and purpose of the present disclosure.

Figure 2:
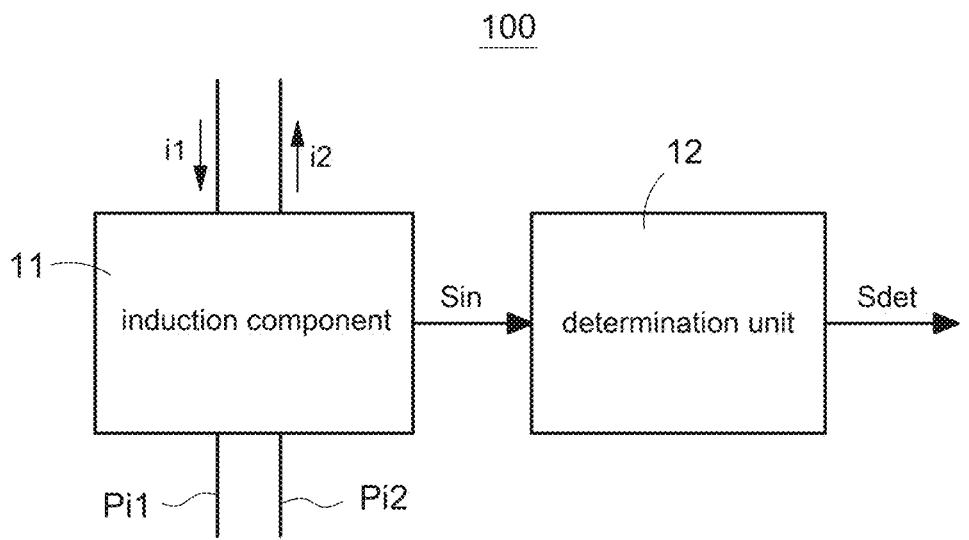
FIG. 2 is a block diagram of a multi-path current difference detection device according to a first embodiment of the present disclosure.

Please refer to FIG. 2, which shows a block diagram of a multi-path current difference detection device according to a first embodiment of the present disclosure. As shown in FIG. 2, the multi-path refers to multiple paths for current to flow through, and does not limit the flow direction of the current in each path, which will be explained first.

As shown in FIG. 2, the multi-path current difference detection device 100 includes an induction component 11 and a determination unit 12. The induction components 11 has the function of inducing a current to generate a magnetic field, and therefore can generate an electrical signal (for example, but not limited to, a voltage signal) through the magnitude of the induced current and the corresponding change in the magnetic field. Therefore, based on the magnitude of the electrical signal, the magnitude of all currents induced on the multiple paths, or the magnitude of the net current, can be known. In the present disclosure, the induction component 11 is a Hall component, a tunnel magnetoresistance (TMR), an anisotropic magnetoresistance (AMR), a giant magnetoresistance (GMR), a colossal magnetoresistance (CMR), an ordinary magnetoresistance (OMR), or a shunt resistor. However, the present disclosure is not limited to these components, that is, any component that can be used to achieve the aforementioned functions and purposes can be used as the induction component 11, and should fall within the scope of the technical content disclosed in the present disclosure.

In particular, the multi-path current difference detection device 100 is an integrated circuit (IC), that is, the multi-path current difference detection device 100 may be implemented as a packaged integrated circuit so the volume and space occupied can be greatly reduced.

The induction component 11 is used to induce a plurality of currents i1, i2 flowing through a plurality of paths Pi1, Pi2. As shown in FIG. 2, two paths, namely a first path Pi1 and a second path Pi2 are taken as an example. Therefore, the induction component 11 can be used to induce the magnitude of the first current i1 flowing through the first path Pi1 and the magnitude of the second current i2 flowing through the second path Pi2. In the present disclosure, the induction component 11 may also be used to induce magnitude of currents flowing through more than two paths, which will not be described in detail here. According to the magnitude of the first current i1 and the magnitude of the second current i2, the induction component 11 calculates a net current value |i1−i2| of a plurality of current values of the plurality of currents i1, i2. That is, the net current value calculated by the induction component 11 is |i1−i2| or |i2−i1|, which means that the net current value only considers the magnitude of the net current value, not the direction of the first current i1 or that of the second current i2. Incidentally, if the net current value of three currents is calculated, the net current value is |i1−i2−i3| or the absolute value of the subtraction of the three currents.

The determination unit 12 is connected to the induction component 11, and receives a current signal Sin corresponding to the net current value |i1−i2| so as to determine that the current signal Sin is greater than or equal to a current threshold to provide a detection signal Sdet. Specifically, the net current value |i1−i2| is the actual current value, and therefore the induction component 11 converts the actual current value into the corresponding current signal Sin. In other words, when the current signal Sin is larger, it means that the net current value |i1−i2| is larger; on the contrary, when the current signal Sin is smaller, it means that the net current value |i1−i2| is smaller. Therefore, the determination unit 12 receives the current threshold, and compares the current signal Sin with the current threshold. If the determination unit 12 determines that the current signal Sin is greater than the current threshold, the determination unit 12 provides the detection signal Sdet.

Incidentally, the induction component 11 may be used to induce an AC (alternating current) current or DC (direct current) current. In one embodiment, the current value corresponding to the current threshold is zero amp. That is, when the current signal Sin is greater than or equal to zero amp (i.e., the current threshold), the determination unit 12 outputs the detection signal Sdet. It means that the net current value |i1−i2| of the first current i1 and the second current i2 is not zero, and therefore a non-zero DC or AC current difference in these paths Pi1, Pi2 can be determined.

In another embodiment, if the first current i1 and the second current i2 are AC currents, and the current value corresponding to the current threshold is 15 milliamps. Therefore, when the current signal Sin is greater than or equal to 15 milliamps (i.e., the current threshold), the determination unit 12 outputs the detection signal Sdet. It means that the net current value |i1−i2| of the first current i1 and the second current i2 is greater than or equal to 15 milliamps, and therefore an AC current difference greater than or equal to 15 milliamps in these paths Pi1, Pi2 can be determined.

In further another embodiment, if the first current i1 and the second current i2 are AC or DC currents, and the current value corresponding to the current threshold is DC 3 to 6 milliamps. Therefore, when the current signal Sin is greater than or equal to 6 milliamps or is less than or equal to 3 milliamps (i.e., the current threshold), the determination unit 12 outputs the detection signal Sdet. It means that the net current value |i1−i2| of the first current i1 and the second current i2 is greater than or equal to 6 milliamps or is less than or equal to 3 milliamps, and therefore a DC current difference greater than or equal to 6 milliamps or less than or equal to 3 milliamps in these paths Pi1, Pi2 can be determined.

Figure 3:
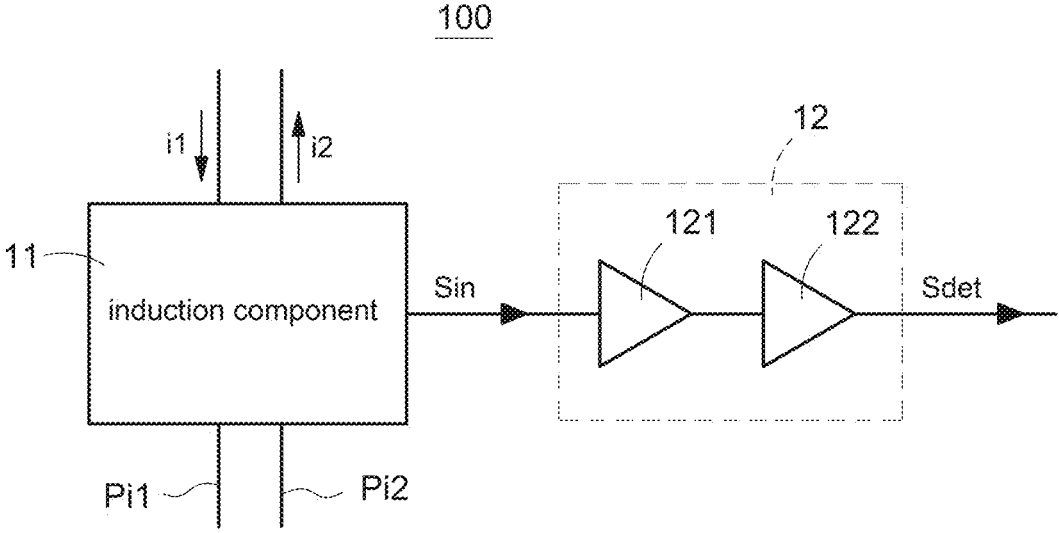
FIG. 3 is a block circuit diagram of the multi-path current difference detection device according to the first embodiment of the present disclosure.

Please refer to FIG. 3, which shows a block circuit diagram of the multi-path current difference detection device according to the first embodiment of the present disclosure. In FIG. 3, an embodiment of the determination unit 12 is further disclosed and explained. As shown in FIG. 3, the determination unit 12 includes a signal amplifier 121 and a voltage follower 122. The signal amplifier 121 receives the current signal Sin and amplifies the current signal Sin. In one embodiment, the signal amplifier 121 is an operational amplifier (OPA). Therefore, the signal amplifier 121 operates as an operational amplifier to receive the current signal Sin and amplify the current signal Sin to generate a corresponding voltage signal. The voltage follower 122 is connected to the signal amplifier 121 and receives the current signal Sin amplified by the signal amplifier 121, that is, receives the voltage signal generated by the signal amplifier 121.

When the determination unit 12 determines that the amplified current signal Sin is greater than or equal to the current threshold, the voltage follower 122 provides the detection signal Sdet with a high level. Corresponding to the previous description, if the current value corresponding to the current threshold is zero amp and the voltage follower 122 outputs the detection signal Sdet with the high level, it means that the net current value |i1−i2| of the first current i1 and the second current i2 is not zero, and therefore a non-zero DC or AC current difference in these paths Pi1, Pi2 can be determined. If the current value corresponding to the current threshold is 15 milliamps and the voltage follower 122 outputs the detection signal Sdet with the high level, it means that the net current value |i1−i2| of the first current i1 and the second current i2 is greater than or equal to 15 milliamps, and therefore an AC current difference greater than or equal to 15 milliamps in these paths Pi1, Pi2 can be determined. If the current value corresponding to the current threshold is between 3 and 6 milliamps and the voltage follower 122 outputs the detection signal Sdet with the high level, it means that the net current value |i1−i2| of the first current i1 and the second current i2 is greater than or equal to 6 milliamps or is less than or equal to 3 milliamps, and therefore a DC current difference greater than or equal to 6 milliamps or less than or equal to 3 milliamps in these paths Pi1, Pi2 can be determined.

On the contrary, when the determination unit 12 determines that the amplified current signal Sin is less than the current threshold, the voltage follower 122 provides the detection signal Sdet with a low level. Corresponding to the previous description, if the current value corresponding to the current threshold is zero amp and the voltage follower 122 outputs the detection signal Sdet with the low level, it means that the net current value |i1−i2| of the first current i1 and the second current i2 is zero, and therefore no DC or AC current difference in these paths Pi1, Pi2 can be determined. If the current value corresponding to the current threshold is 15 milliamps and the voltage follower 122 outputs the detection signal Sdet with the low level, it means that the net current value |i1−i2| of the first current i1 and the second current i2 is less than 15 milliamps, and therefore no AC current difference greater than or equal to 15 milliamps in these paths Pi1, Pi2 can be determined. If the current value corresponding to the current threshold is between 3 and 6 milliamps and the voltage follower 122 outputs the detection signal Sdet with the low level, it means that the net current value |i1−i2| of the first current i1 and the second current i2 is less than 6 milliamps or is greater than 3 milliamps, and therefore no DC current difference greater than or equal to 6 milliamps or less than or equal to 3 milliamps in these paths Pi1, Pi2 can be determined.

However, the above-mentioned detection signal Sdet with the high level is not limited to be used to determine that the net current value |i1−i2| is greater than or equal to the current threshold, and the detection signal Sdet with the low level is not limited to be used to determine that the net current value |i1−i2| is less than the current threshold. In other words, the signal level may be reversed, and the relationship between the net current value |i1−i2| and the current threshold can also be determined. For example, if the current threshold is set to zero amp and the voltage follower 122 outputs the detection signal Sdet with the low level, it means that the net current value |i1−i2| of the first current i1 and the second current i2 is not zero. On the contrary, if the voltage follower 122 outputs the detection signal Sdet with the high level, it means that the net current value |i1−i2| of the first current i1 and the second current i2 is zero.

Figure 4:
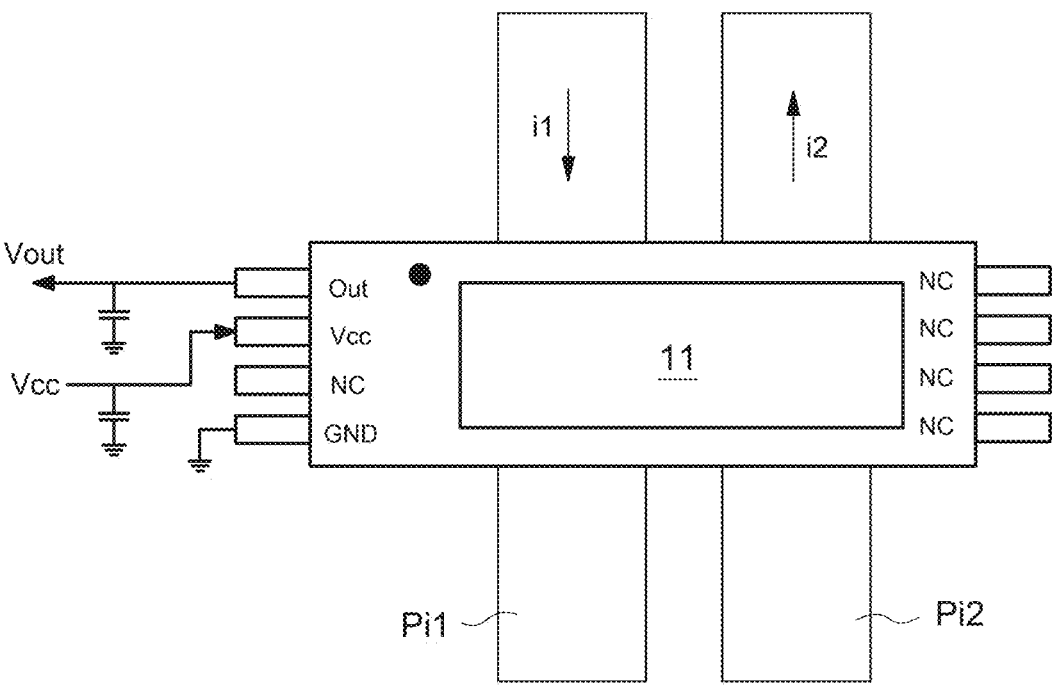
FIG. 4 is a first schematic diagram of the multi-path current difference detection device implemented in an integrated circuit according to the first embodiment of the present disclosure.

Please refer to FIG. 4, which shows a first schematic diagram of the multi-path current difference detection device implemented in an integrated circuit according to the first embodiment of the present disclosure. As mentioned above, the multi-path current difference detection device 100 may be implemented as a packaged integrated circuit, and therefore, in FIG. 4, the multi-path current difference detection device 100 is an integrated circuit for multi-path current difference detection. The multi-path current difference detection device 100 is disposed above the first path Pi1 and the second path Pi2 in a contactless manner, where the first path Pi1 and the second path Pi2 may be bus bars or traces of a printed circuit board (PCB). Taking the bus bars as an example, as shown in FIG. 4, the multi-path current difference detection device 100 is disposed on the first path Pi1 and the second path Pi2 of the bus bars in a non-contact manner. The first current i1 flowing through the first path Pi1 and the second current i2 flowing through the second path Pi2 are induced by the induction component 11, and then the induction component 11 calculates a net current value |i1−i2| of the first current i1 and the second current i2. Afterward, the determination unit 12 receives a current signal Sin corresponding to the net current value |i1−i2|, and determines that the current signal Sin is greater than or equal to a current threshold to provide a detection signal Sdet. As shown in FIG. 4, the multi-path current difference detection device 100 can output the detection signal Sdet as an output voltage Vout through an output pin Out. Furthermore, the multi-path current difference detection device 100 can acquire the required power through a power supply voltage Vcc externally provided.

Figure 5:
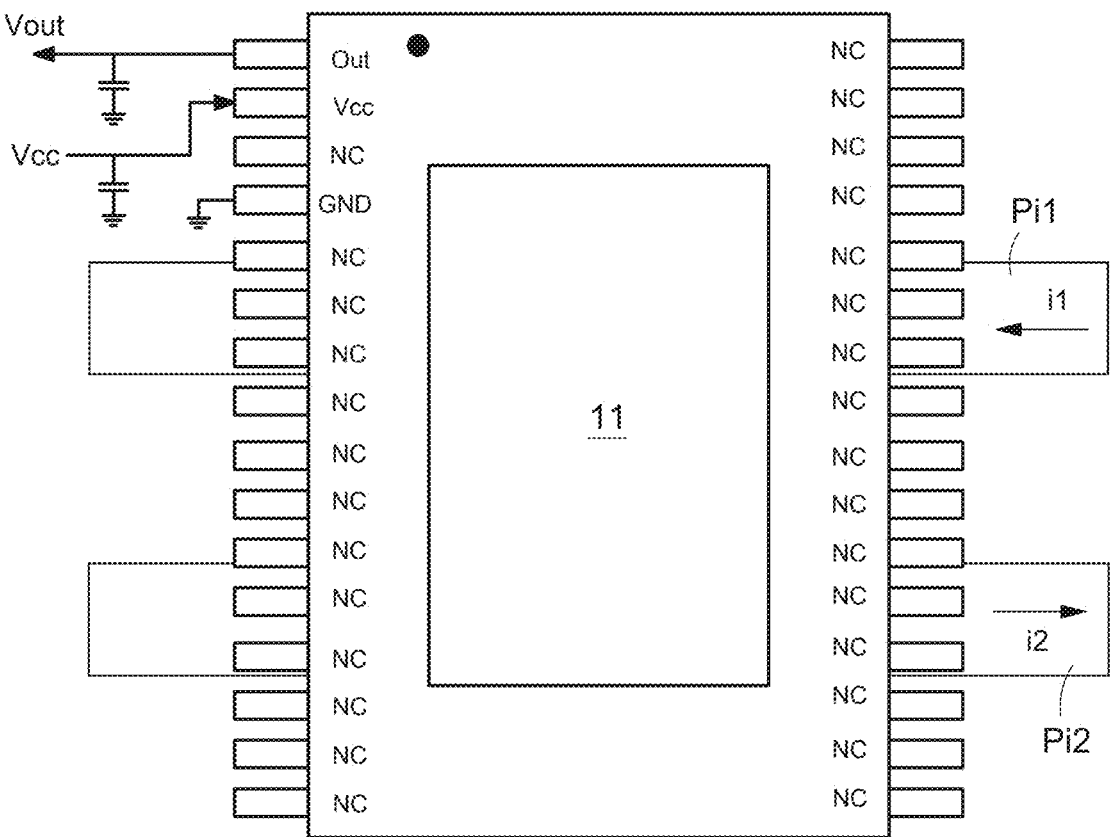
FIG. 5 is a second schematic diagram of the multi-path current difference detection device implemented in the integrated circuit according to the first embodiment of the present disclosure.

Please refer to FIG. 5, which shows a second schematic diagram of the multi-path current difference detection device implemented in the integrated circuit according to the first embodiment of the present disclosure. Taking the bus bars as an example, as shown in FIG. 5, the multi-path current difference detection device 100 is disposed on the first path Pi1 and the second path Pi2 of the bus bars in a non-contact manner. The first current i1 flowing through the first path Pi1 and the second current i2 flowing through the second path Pi2 are induced by the induction component 11, and then the induction component 11 calculates a net current value |i1−i2| of the first current i1 and the second current i2. Afterward, the determination unit 12 receives a current signal Sin corresponding to the net current value |i1−i2|, and determines that the current signal Sin is greater than or equal to a current threshold to provide a detection signal Sdet. As shown in FIG. 5, the multi-path current difference detection device 100 can output the detection signal Sdet as an output voltage Vout through an output pin Out. Furthermore, the multi-path current difference detection device 100 can acquire the required power through a power supply voltage Vcc externally provided.

Figure 6A:
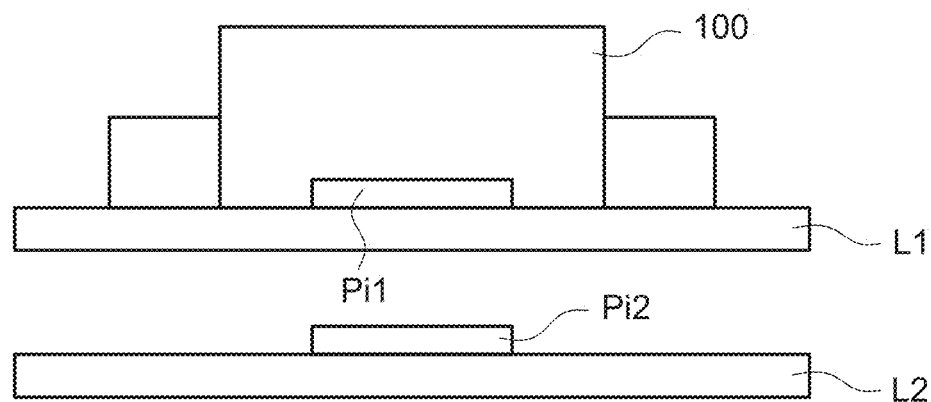
FIG. 6A to FIG. 6C show schematic diagrams of the multi-path current difference detection device applied to a circuit board with a laminated structure according to the present disclosure.
Figure 6B:
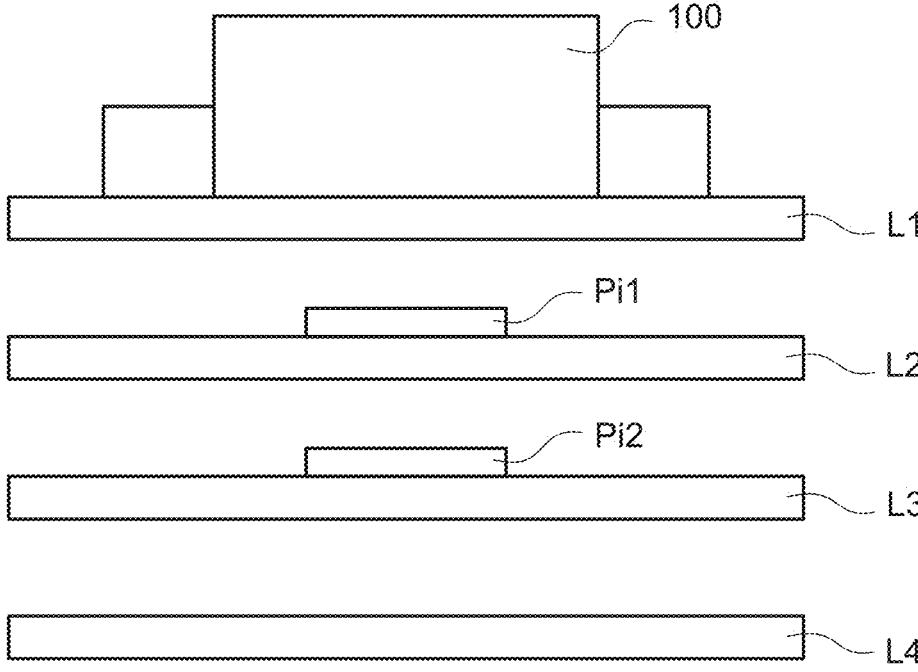
Figure 6C:
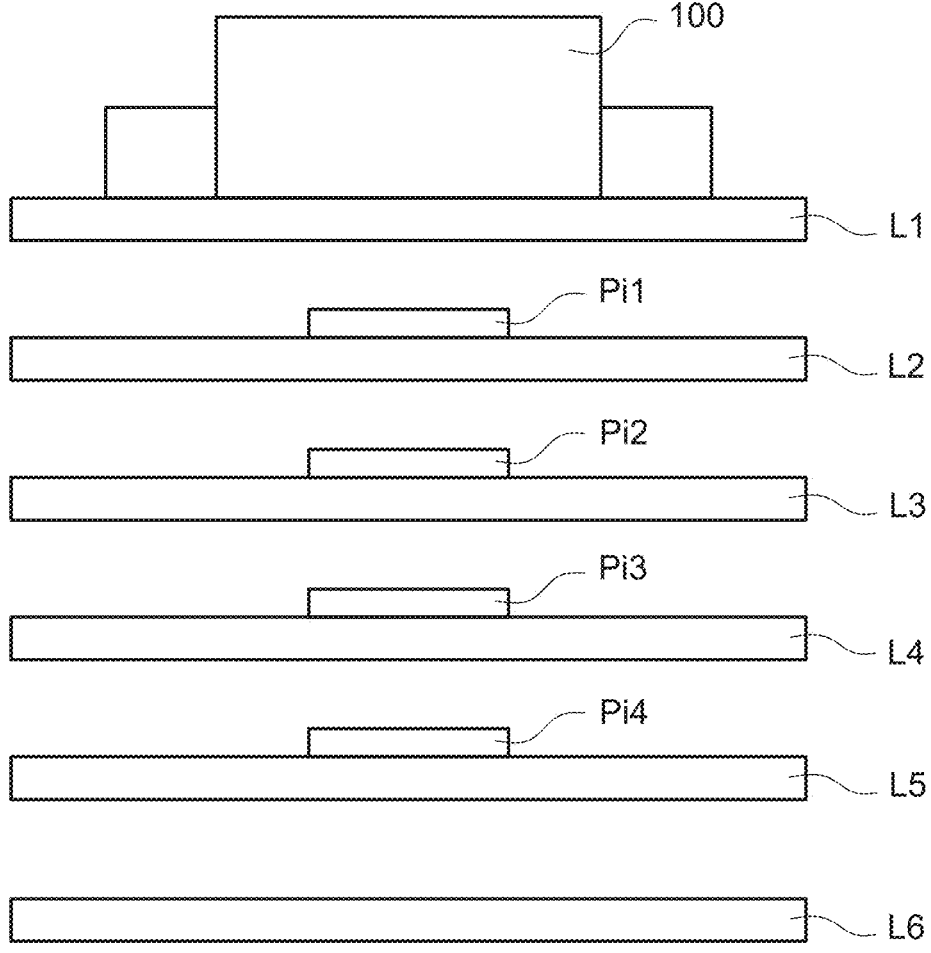

Please refer to FIG. 6A to FIG. 6C, which show schematic diagrams of the multi-path current difference detection device applied to a circuit board with a laminated structure according to the present disclosure. Incidentally, the content shown in FIG. 6A to FIG. 6C is mainly to clearly and conveniently present the schematic diagram of the multi-path current difference detection device 100 applied to a circuit board with a laminated structure, which will be explained first. The multi-path current difference detection device 100 is disposed on a circuit board, and the circuit board includes a plurality of layer boards with a laminated structure, in which the first path Pi1 and the second path Pi2 are respectively configured on different layer boards. As shown in FIG. 6A, the circuit board includes two layer boards, i.e., a first layer board L1 and a second layer board L2, and the first path Pi1 is configured on the first layer board L1 and the second path Pi2 is configured on the second layer board L2. The multi-path current difference detection device 100 is disposed above the first path Pi1 and the second path Pi2 in a non-contact manner, and is electrically connected to the first layer L1 of the circuit board. Therefore, through the previously disclosed technical means, the induction component and the determination unit 12 are used to realize multi-path current difference detection, which will not be described in detail here.

As shown in FIG. 6B, the circuit board includes four layer boards, i.e., a first layer board L1, a second layer board L2, a third layer board L3, and a fourth layer board L4, and the first path Pi1 is configured on the second layer board L2 and the second path Pi2 is configured on the third layer board L3. However, this is not a limitation, and the number of multiple paths and their configured layer locations are not limited. The multi-path current difference detection device 100 is disposed above the first path Pi1 and the second path Pi2 in a non-contact manner, and is electrically connected to the first layer L1 of the circuit board. Therefore, through the previously disclosed technical means, the induction component and the determination unit 12 are used to realize multi-path current difference detection, which will not be described in detail here.

As shown in FIG. 6C, the circuit board includes six layer boards, i.e., a first layer board L1, a second layer board L2, a third layer board L3, a fourth layer board L4, a fifth layer board L5, and a sixth layer board L6, and the first path Pi1 is configured on the second layer board L2, the second path Pi2 is configured on the third layer board L3, the third path Pi3 is configured on the fourth layer board L4, and the fourth path Pi4 is configurated on the fifth layer board L5. However, this is not a limitation, and the number of multiple paths and their configured layer locations are not limited. The multi-path current difference detection device 100 is disposed above the first path Pi1, the second path Pi2, the third path Pi3, and the fourth path Pi4 in a non-contact manner, and is electrically connected to the first layer L1 of the circuit board. Therefore, through the previously disclosed technical means, the induction component and the determination unit 12 are used to realize multi-path current difference detection, which will not be described in detail here.

Figure 7:
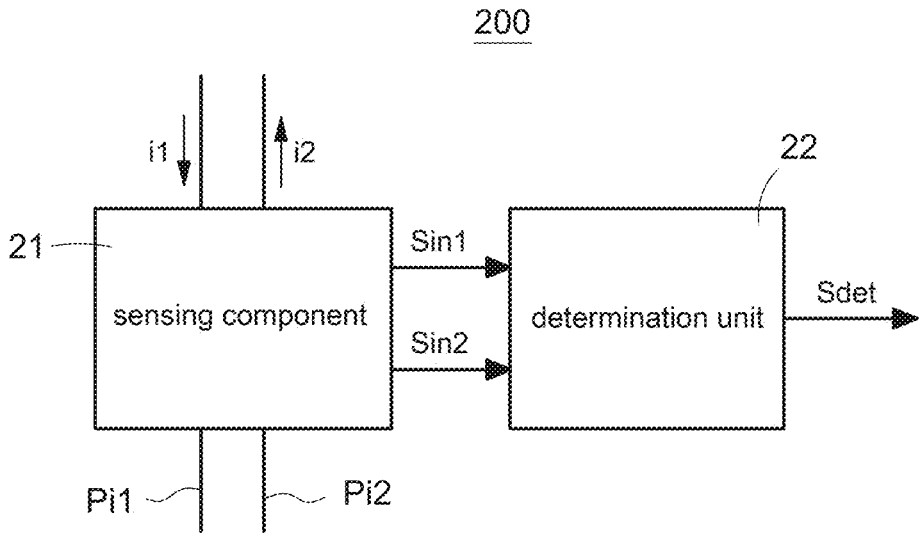
FIG. 7 is a block diagram of the multi-path current difference detection device according to a second embodiment of the present disclosure.

Please refer to FIG. 7, which shows a block diagram of the multi-path current difference detection device according to a second embodiment of the present disclosure. As shown in FIG. 7, the multi-path current difference detection device 200 includes a sensing component 21 and a determination unit 12. Compared with the non-contact detection method of the first embodiment shown in FIG. 2, the multi-path current difference detection device 200 of this embodiment detects in a contact manner, and therefore, the sensing component 21 is used to directly sense the current in a contact manner. In the present disclosure, the sensing component 21 is a Hall component, a tunnel magnetoresistance (TMR), an anisotropic magnetoresistance (AMR), a giant magnetoresistance (GMR), a colossal magnetoresistance (CMR), an ordinary magnetoresistance (OMR), or a shunt resistor. However, the present disclosure is not limited to these components, that is, any component that can be used to achieve the aforementioned functions and purposes can be used as the sensing component 21, and should fall within the scope of the technical content disclosed in the present disclosure.

In particular, the multi-path current difference detection device 200 is an integrated circuit (IC), that is, the multi-path current difference detection device 200 may be implemented as a packaged integrated circuit so the volume and space occupied can be greatly reduced.

The sensing component 21 is used to receive a plurality of currents $i1$, $i2$ flowing through a plurality of paths $Pi1$, $Pi2$. As shown in FIG. 7, two paths, namely a first path $Pi1$ and a second path $Pi2$ are taken as an example. The sensing component 21 receives the magnitude of the first current $i1$ flowing through the first path $Pi1$ and the magnitude of the second current $i2$ flowing through the second path $Pi2$. In the present disclosure, the sensing component 21 may also be used to receive magnitude of currents flowing through more than two paths, which will not be described in detail here.

The determination unit 22 is connected to the sensing component 21, and receives a plurality of current signals $Sin1$, $Sin2$ of a plurality of current values corresponding to plurality of currents $i1$, $i2$. In other words, the determination unit 22 receives a first current signal $Sin1$ of a current value corresponding to a first current $i1$, and receives a second current signal $Sin2$ of a current value corresponding to a second current $i2$. Furthermore, the determination unit 22 calculates a net current value $|i1-i2|$ of the first current $i1$ and the second current $i2$. That is, the net current value calculated by the determination unit 22 is $|i1-i2|$ or $|i2-i1|$, which means that the net current value only considers the magnitude of the net current value, not the direction of the first current $i1$ or that of the second current $i2$.

The determination unit 22 determinates that a net current signal corresponding to the net current value $|i1-i2|$ is greater than or equal to a current threshold to provide a detection signal Sdet. Specifically, the sensing component 21 converts the actual current value of the first current $i1$ into the corresponding first current signal $Sin1$, which means that the larger the first current signal $Sin1$ is, the larger the first current $i1$ is, and vice versa, and converts the actual current value of the second current $i2$ into the corresponding second current signal $Sin2$, which means that the larger the second current signal $Sin2$ is, the larger the second current $i2$ is, and vice versa. The first current signal $Sin1$ and the second current signal $Sin2$ are provided to the determination unit 22. The determination unit 22 calculates the net current value of the first current $i1$ and the second current $i2$ according to the first current signal $Sin1$ and the second current signal $Sin2$. Therefore, the determination unit 22 receives the current threshold and compares the net current signal corresponding to the net current value $|i1-i2|$ with the current threshold. If the determination unit 22 determinates that the net current signal is greater than or equal to the current threshold, the determination unit 22 provides the detection signal Sdet.

Incidentally, the sensing component 21 may be used to sense an AC (alternating current) current or DC (direct current) current. In one embodiment, the current value corresponding to the current threshold is zero amp. That is, when the net current signal is greater than or equal to zero amp (i.e., the current threshold), the determination unit 22 outputs the detection signal Sdet. It means that the net current value $|i1-i2|$ of the first current $i1$ and the second current $i2$ is not zero, and therefore a non-zero DC or AC current difference in these paths $Pi1$, $Pi2$ can be determined.

In another embodiment, if the first current $i1$ and the second current $i2$ are AC currents, and the current value corresponding to the current threshold is 15 milliamps. Therefore, when the net current signal is greater than or equal to 15 milliamps (i.e., the current threshold), the determination unit 22 outputs the detection signal Sdet. It means that the net current value $|i1-i2|$ of the first current $i1$ and the second current $i2$ is greater than or equal to 15 milliamps, and therefore an AC current difference greater than or equal to 15 milliamps in these paths $Pi1$, $Pi2$ can be determined.

In further another embodiment, if the first current $i1$ and the second current $i2$ are AC or DC currents, and the current value corresponding to the current threshold is DC 3 to 6 milliamps. Therefore, when the net current signal is greater than or equal to 6 milliamps or is less than or equal to 3 milliamps (i.e., the current threshold), the determination unit 22 outputs the detection signal Sdet. It means that the net current value $|i1-i2|$ of the first current $i1$ and the second current $i2$ is greater than or equal to 6 milliamps or is less than or equal to 3 milliamps, and therefore a DC current difference greater than or equal to 6 milliamps or less than or equal to 3 milliamps in these paths $Pi1$, $Pi2$ can be determined.

Figure 8:
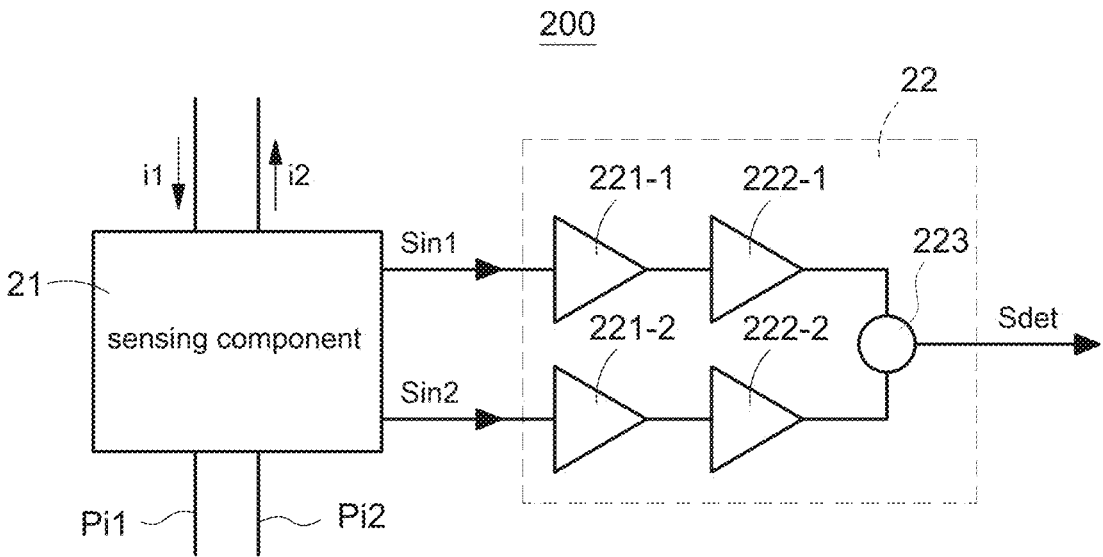
FIG. 8 is a block circuit diagram of the multi-path current difference detection device according to the second embodiment of the present disclosure.

Please refer to FIG. 8, which shows a block circuit diagram of the multi-path current difference detection device according to the second embodiment of the present disclosure. As shown in FIG. 8, the implementation of the determination unit 22 is further disclosed and explained. The determination unit 22 includes a plurality of signal amplifiers 221-1, 221-2, a plurality of voltage followers 222-1, 222-2, and a computation unit 223. The plurality of signal amplifiers 221-1, 221-2 respectively receive the current signals $Sin1$, $Sin2$, and respectively amplify the current signals $Sin1$, $Sin2$. In one embodiment, each signal amplifier is an operational amplifier (OPA). Therefore, the first signal amplifier 221-1 operates as an operational amplifier to receive the first current signal $Sin1$ and amplify the first current signal $Sin1$; the second signal amplifier 221-2 operates as an operational amplifier to receive the second current signal $Sin2$ and amplify the second current signal $Sin2$.

The plurality of voltage followers 222-1, 222-2 are correspondingly connected to the plurality of signal amplifiers 221-1, 221-2, and respectively receive the current signals $Sin1$, $Sin2$ amplified by the plurality of signal amplifiers 221-1, 221-2. Specifically, the first voltage follower 222-1 is connected to the first signal amplifier 221-1, and receives the first current signal $Sin1$ amplified by the first signal amplifier 221-1; the second voltage follower 222-2 is connected to the second signal amplifier 221-2, and receives the second current signal Sin2 amplified by the second signal amplifier 221-2.

The computation unit 223 is connected to the plurality of voltage followers 222-1, 222-2, respectively receive the current signals Sin1, Sin2 amplified by the plurality of signal amplifiers 221-1, 221-2, and sum up the current signals Sin1, Sin2 to generate the net current signal corresponding to the net current value. Specifically, the computation unit 223 is connected to the first voltage follower 222-1 and the second voltage follower 222-2, respectively receive the amplified first current signal Sin1 and the amplified second current signal Sin2, and further sum the amplified first current signal Sin1 and the amplified second current signal Sin2 to generate the net current signal corresponding to the net current value |i1−i2|.

When the determination unit 22 determines that the net current signal is greater than or equal to the current threshold, the computation unit 223 provides the detection signal Sdet with a high level. Corresponding to the previous description, if the current value corresponding to the current threshold is zero amp and the computation unit 223 outputs the detection signal Sdet with the high level, it means that the net current value |i1−i2| of the first current i1 and the second current i2 is not zero, and therefore a non-zero DC or AC current difference in these paths Pi1, Pi2 can be determined. If the current value corresponding to the current threshold is 15 milliamps and the computation unit 223 outputs the detection signal Sdet with the high level, it means that the net current value |i1−i2| of the first current i1 and the second current i2 is greater than or equal to 15 milliamps, and therefore an AC current difference greater than or equal to 15 milliamps in these paths Pi1, Pi2 can be determined. If the current value corresponding to the current threshold is between 3 and 6 milliamps and the computation unit 223 outputs the detection signal Sdet with the high level, it means that the net current value |i1−i2| of the first current i1 and the second current i2 is greater than or equal to 6 milliamps or is less than or equal to 3 milliamps, and therefore a DC current difference greater than or equal to 6 milliamps or less than or equal to 3 milliamps in these paths Pi1, Pi2 can be determined.

On the contrary, when the determination unit 12 determines that the net current signal is less than the current threshold, the computation unit 223 provides the detection signal Sdet with a low level. Corresponding to the previous description, if the current value corresponding to the current threshold is zero amp and the computation unit 223 outputs the detection signal Sdet with the low level, it means that the net current value |i1−i2| of the first current i1 and the second current i2 is zero, and therefore no DC or AC current difference in these paths Pi1, Pi2 can be determined. If the current value corresponding to the current threshold is 15 milliamps and the computation unit 223 outputs the detection signal Sdet with the low level, it means that the net current value |i1−i2| of the first current i1 and the second current i2 is less than 15 milliamps, and therefore no AC current difference greater than or equal to 15 milliamps in these paths Pi1, Pi2 can be determined. If the current value corresponding to the current threshold is between 3 and 6 milliamps and the computation unit 223 outputs the detection signal Sdet with the low level, it means that the net current value |i1−i2| of the first current i1 and the second current i2 is less than 6 milliamps or is greater than or equal to 3 milliamps, and therefore no DC current difference greater than or equal to 6 milliamps or less than or equal to 3 milliamps in these paths Pi1, Pi2 can be determined.

However, the above-mentioned detection signal Sdet with the high level is not limited to be used to determine that the net current value |i1−i2| is greater than or equal to the current threshold, and the detection signal Sdet with the low level is not limited to be used to determine that the net current value |i1−i2| is less than the current threshold. In other words, the signal level may be reversed, and the relationship between the net current value |i1−i2| and the current threshold can also be determined. For example, if the current threshold is set to zero amp and the computation unit 223 outputs the detection signal Sdet with the low level, it means that the net current value |i1−i2| of the first current i1 and the second current i2 is not zero. On the contrary, if the computation unit 223 outputs the detection signal Sdet with the high level, it means that the net current value |i1−i2| of the first current i1 and the second current i2 is zero.

Figure 9:
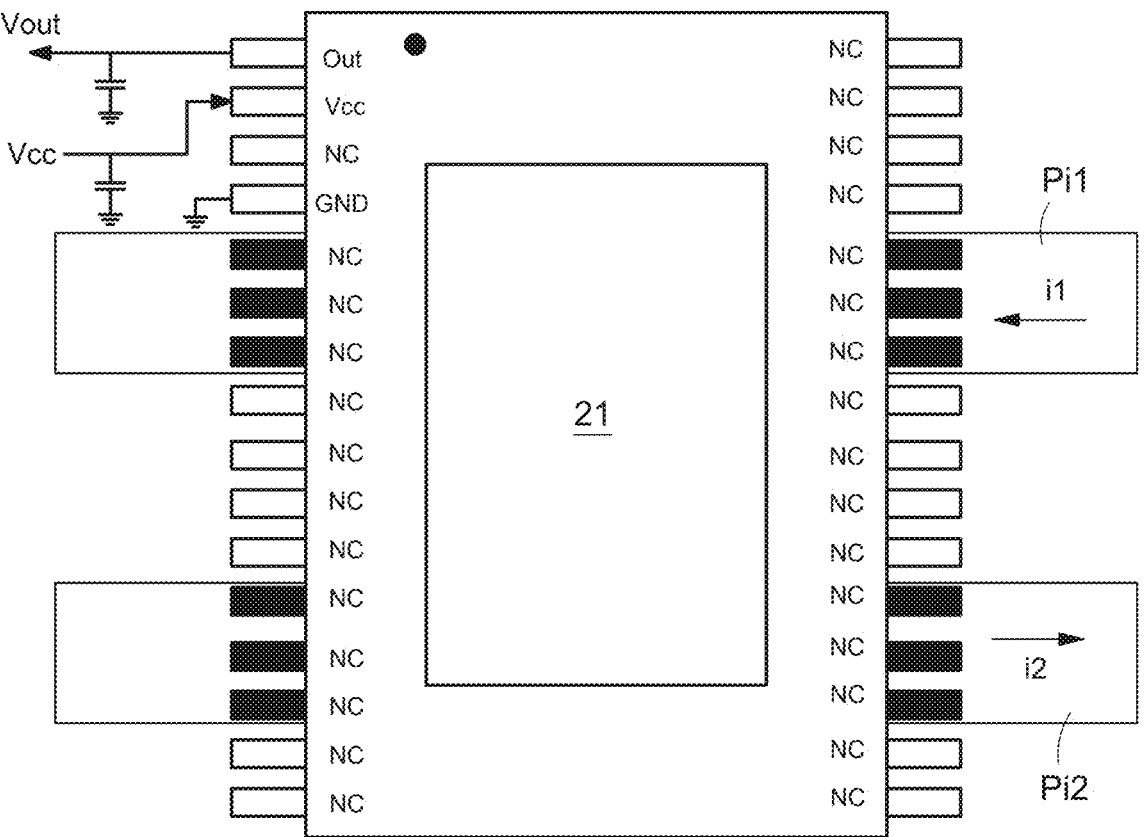
FIG. 9 is a schematic diagram of the multi-path current difference detection device implemented in an integrated circuit according to the second embodiment of the present disclosure.

Please refer to FIG. 9, which shows a schematic diagram of the multi-path current difference detection device implemented in an integrated circuit according to the second embodiment of the present disclosure. As mentioned above, the multi-path current difference detection device 200 may be implemented as a packaged integrated circuit, and therefore, in FIG. 9, the multi-path current difference detection device 200 is an integrated circuit for multi-path current difference detection. The multi-path current difference detection device 200 is disposed on the first path Pi1 and the second path Pi2 in a contact manner, where the first path Pi1 and the second path Pi2 may be bus bars or traces of a printed circuit board (PCB). Specifically, pins of the integrated circuit of the multi-path current difference detection device 200 are directly connected to the first path Pi1 and the second path Pi2, and therefore the first current i1 and the second current i2 are received by the pins of the integrated circuit. Furthermore, through the sensing component 21 and the determination unit 22 provided in the integrated circuit, the currents are received, the net current value is calculated, the net current signal and the current threshold are determined, and the detection signal Sdet is outputted, thereby realizing the multi-path current difference detection in a contact manner, which will not be described in detail here. As shown in FIG. 9, the multi-path current difference detection device 200 can output the detection signal Sdet as an output voltage Vout through an output pin Out. Furthermore, the multi-path current difference detection device 200 can acquire the required power through a power supply voltage Vcc externally provided.

In summary, the present disclosure has the following features and advantages:

1. The multi-path current difference detection device of the present disclosure may be implemented as a packaged integrated circuit, and therefore the volume and occupied can be greatly reduced.
2. The multi-path current difference detection device of the present disclosure can implement multi-path current difference detection in a non-contact manner or a contact manner.
3. The multi-path current difference detection device of the present disclosure can be used to detect AC current or DC current.
4. In a preferred embodiment, an AC current difference of more than 15 mA can be accurately detected, or a DC current difference between 3 and 6 mA can be accurately detected.
5. Electromagnetic interference (EMI) can be avoided through the spacing design of different current paths.
6. The detection time of the current difference detection of the present disclosure can be less than 1 second.

13

14

7. The detection accuracy of the current difference detection of the present disclosure is higher than 95% (that is, the error is lower than 5%).

8. The multi-path current difference detection device of the present disclosure can operate in an environment higher than 150° C.

9. The distance between multiple layer boards of the circuit board of the present disclosure having a laminated structure can be designed to be 0.4±0.1 mm.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A multi-path current difference detection device disposed on a circuit board, and the circuit board comprising a plurality of layer boards with a laminated structure, the multi-path current difference detection device comprising:

an induction component configured to induce a plurality of currents flowing through a plurality of paths, and calculate a net current value of a plurality of current values of the plurality of currents, wherein the plurality of paths are respectively disposed on different layer boards, and a determination unit configured to receive a current signal corresponding to the net current value, and provide a detection signal when determining that the current signal is greater than or equal to a current threshold.

2. The multi-path current difference detection device as claimed in claim 1, wherein the determination unit comprises:

a signal amplifier configured to receive the current signal and amplify the current signal, and a voltage follower connected to the signal amplifier and receive the current signal amplified by the signal amplifier, wherein based on the current signal amplified by the signal amplifier being greater than or equal to the current threshold, the voltage follower is configured to provide the detection signal with a high level, wherein based on the current signal amplified by the signal amplifier being less than the current threshold, the voltage follower is configured to provide the detection signal with a low level.

3. The multi-path current difference detection device as claimed in claim 1, wherein the multi-path current difference detection device is an integrated circuit.

4. The multi-path current difference detection device as claimed in claim 1, wherein a current value corresponding to the current threshold is zero amp.

5. The multi-path current difference detection device as claimed in claim 1, wherein each current is an alternating-current current, and a current value corresponding to the current threshold is 15 milliamps.

6. The multi-path current difference detection device as claimed in claim 1, wherein each current is an alternating-current current or a direct-current current, and a current value corresponding to the current threshold is direct-current 3 to 6 milliamps.

7. The multi-path current difference detection device as claimed in claim 1, wherein the induction component is a Hall component, a tunneling magnetoresistance, an anisotropic magnetoresistance, a giant magnetoresistance, a colossal magnetoresistance, an ordinary magnetoresistance, or a shunt resistor.

8. The multi-path current difference detection device as claimed in claim 2, wherein the signal amplifier is an operational amplifier.

9. A multi-path current difference detection device disposed on a circuit board, and the circuit board comprising a plurality of layer boards with a laminated structure, the multi-path current difference detection device comprising:

a sensing component configured to receive a plurality of currents flowing through a plurality of paths, wherein the plurality of paths are respectively disposed on different layer boards, and a determination unit configured to receive a plurality of current signals corresponding to a plurality of current values of the plurality of currents, calculate a net current value of the plurality of current values, and provide a detection signal when determining that a net current signal corresponding to the net current value is greater than or equal to a current threshold.

10. The multi-path current difference detection device as claimed in claim 9, wherein the determination unit comprises:

a plurality of signal amplifiers configured to respectively receive the plurality of current signals and respectively amplify the plurality of current signals, and a plurality of voltage followers correspondingly connected to the plurality of signal amplifiers and respectively receive the plurality of current signals amplified by the plurality of signal amplifiers, and a computation circuit connected to the plurality of voltage followers, the computation circuit comprising a summing circuit and a comparator, and the computation circuit configured to respectively receive the plurality of current signals amplified by the plurality of signal amplifiers, and use the summing circuit to sum the plurality of current signals to generate the net current signal corresponding to the net current value, wherein based on the net current signal being greater than or equal to the current threshold, the comparator of the computation circuit is configured to provide the detection signal with a high level, wherein based on the net current signal being less than the current threshold, the comparator of the computation circuit is configured to provide the detection signal with a low level.

11. The multi-path current difference detection device as claimed in claim 9, wherein the multi-path current difference detection device is an integrated circuit.

12. The multi-path current difference detection device as claimed in claim 9, wherein a current value corresponding to the current threshold is zero amp.

13. The multi-path current difference detection device as claimed in claim 9, wherein each current is an alternating-current current, and a current value corresponding to the current threshold is 15 milliamps.

14. The multi-path current difference detection device as claimed in claim 9, wherein each current is an alternating-current current or a direct-current current, and a current value corresponding to the current threshold is direct-current 3 to 6 milliamps.

15. The multi-path current difference detection device as claimed in claim 9, wherein the sensing component is a Hall component, a tunneling magnetoresistance, an anisotropic magnetoresistance, a giant magnetoresistance, a colossal magnetoresistance, an ordinary magnetoresistance, or a shunt resistor.

16. The multi-path current difference detection device as claimed in claim 10, wherein the signal amplifier is an operational amplifier.

\* \* \* \* \*